United States Patent
Han et al.

(10) Patent No.: US 8,435,705 B2
(45) Date of Patent: May 7, 2013

(54) METHODS OF CORRECTING OPTICAL PARAMETERS IN PHOTOMASKS

(75) Inventors: Haek-seung Han, Hwaseong-si (KR); Dong-seok Nam, Yongin-si (KR); Sang-gyun Woo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 13/072,993

(22) Filed: Mar. 28, 2011

(65) Prior Publication Data
US 2011/0244374 A1 Oct. 6, 2011

(30) Foreign Application Priority Data
Mar. 31, 2010 (KR) .................. 10-2010-0029349

(51) Int. Cl.
*G03F 1/70* (2012.01)
*G03F 1/72* (2012.01)

(52) U.S. Cl.
USPC .......................................................... 430/5

(58) Field of Classification Search ............ 430/5, 394; 716/50–56; 355/53
See application file for complete search history.

(56) References Cited

U.S. PATENT DOCUMENTS

| 8,137,870 B2 * | 3/2012 | Lee et al. ............... 430/5 |
| 2007/0059608 A1 * | 3/2007 | Ikuta et al. ............. 430/5 |
| 2010/0112464 A1 * | 5/2010 | Kanamitsu ............ 430/5 |

FOREIGN PATENT DOCUMENTS

| JP | 2002-118056 | 4/2002 |
| JP | 2003-282411 | 10/2003 |
| KR | 10 2009 0057093 A | 6/2009 |
| KR | 10 2009 0057113 A | 6/2009 |

* cited by examiner

*Primary Examiner* — Stephen Rosasco
(74) *Attorney, Agent, or Firm* — Myers Bigel Sibley & Sajovec

(57) ABSTRACT

A method of correcting an optical parameter in a photomask is provided. The method includes providing a photomask, exposing the photomask, detecting an aerial image to estimate the photomask, and irradiating gas cluster ion beams to the photomask based on an estimation result to correct the optical parameter in the photomask in relation to the aerial image. The gas cluster ion beams may be irradiated to a front surface of the photomask on which a mask pattern is formed or a rear surface of the photomask on which the mask pattern is not formed.

13 Claims, 13 Drawing Sheets

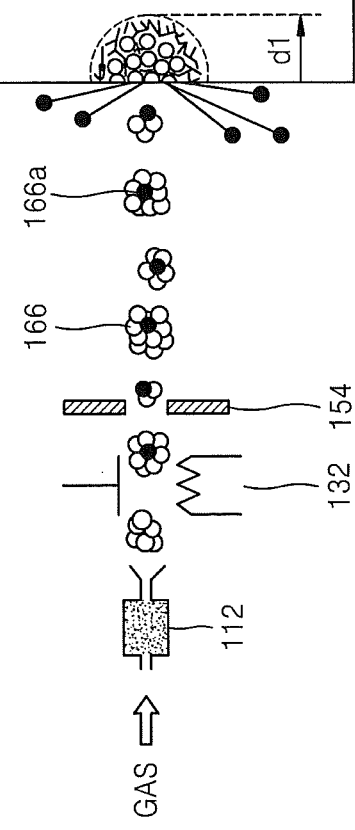
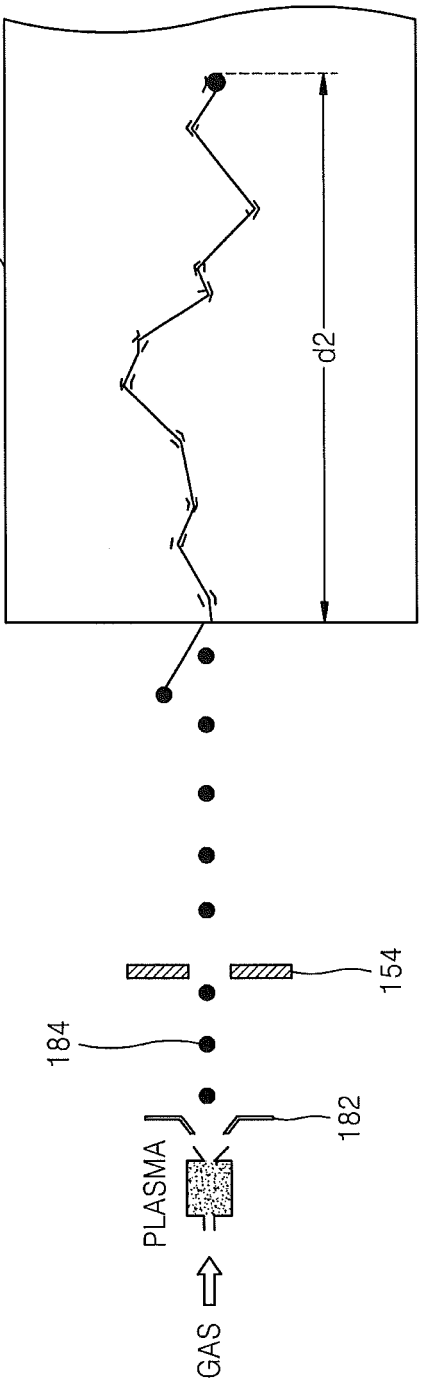

METHODS OF CORRECTING OPTICAL PARAMETERS IN PHOTOMASKS

CROSS-REFERENCE TO RELATED APPLICATIONS

This application claims the benefit of Korean Patent Application No. 10-2010-0029349, filed on Mar. 31, 2010, in the Korean Intellectual Property Office, the disclosure of which is incorporated herein in its entirety by reference.

BACKGROUND

A plurality of circuit patterns (or photoresist patterns) may be mostly formed on a wafer using a photolithography process. In particular, with a reduction in the design rule of semiconductor devices, more attention may be paid to the importance of the critical-dimension (CD) uniformity of circuit patterns.

Although the CD uniformity of the circuit patterns may be affected by optical factors, such as a light source, lens, and aperture of an exposure apparatus, the CD uniformity of circuit patterns of a highly integrated semiconductor device may be affected by the CD of mask patterns of a photomask. Thus, to increase the CD uniformity of the circuit patterns formed on a wafer, the CD uniformity of the mask patterns of the photomask may be increased.

To increase the CD uniformity of the mask patterns, the CD of the photomask may be corrected. For example, when the mask patterns have a large CD, a predetermined treatment should be performed on the photomask to reduce the CD of the mask patterns.

Also, the CD uniformity of the circuit patterns may be affected by a process parameter of a semiconductor fabrication process, for example, a development process. To improve the CD uniformity of the circuit patterns, the process parameter of the development process may be controlled. The CD of the mask patterns may also be corrected. However, such correction may benefit by improved global CD uniformity and local CD uniformity.

SUMMARY

The inventive concept provides methods of correcting an optical parameter in a photomask, which may improve the critical-dimension (CD) uniformity of the photomask. Methods of correcting an optical parameter in a photomask may include providing a photomask, exposing the photomask and detecting an aerial image that estimates the photomask, and irradiating gas cluster ion beams to the photomask based on an estimation result to correct the optical parameter in the photomask in relation to the aerial image.

In some embodiments, the gas cluster ion beams are irradiated to a front surface of the photomask on which a mask pattern is formed or a rear surface of the photomask on which the mask pattern is not formed. Some embodiments provide that the optical parameter is a transmittance and some embodiments provide that the optical parameter is a reflectance.

In some embodiments, estimating the photomask includes comparing a measured critical dimension (CD) of the aerial image with a designed CD of the photomask. Correcting the optical parameter may include correcting the transmittance of the photomask based on a result of a comparison between the measured CD and the designed CD. In some embodiments, correcting the transmittance of the photomask includes forming a transmittance control region in the photomask. Correcting the optical parameter may include correcting the reflectance of the photomask based on a result of a comparison between the measured CD and the designed CD. Some embodiments provide that correcting the reflectance of the photomask includes forming a reflectance control region in the photomask.

In some embodiments, irradiating the gas cluster ion beams is performed by a gas cluster ion beam irradiation apparatus that includes a cluster generator configured to generate gas clusters, an ionizer configured to ionize the gas clusters, and an accelerator configured to accelerate the ionized gas clusters.

Some embodiments described herein include methods of correcting an optical parameter in a photomask. Such methods may include providing a photomask including multiple sections, exposing the photomask to light to detect an aerial image of each of the sections, comparing a measured critical dimension (CD) of the aerial image with a designed CD of the photomask to estimate the photomask, and irradiating gas cluster ion beams to at least one of the sections based on an estimation result to correct the optical parameter in relation with the aerial image.

In some embodiments, exposing the photomask to detect the aerial image of each of the sections is performed using the same illumination system as an exposure process for transferring the photomask to a wafer. Some embodiments provide that correcting the optical parameter includes forming a transmittance control region or a reflectance control region in the photomask based on a result of a comparison between the measured CD and the designed CD to correct a transmittance or a reflectance of the photomask. In some embodiments, the transmittance control region or the reflectance control region is formed in the vicinity of a front surface of the photomask on which a mask pattern is formed or in the vicinity of a rear surface of the photomask on which the mask pattern is not formed.

Some embodiments provide that irradiating the gas cluster ion beams is performed by a gas cluster ion beam irradiation apparatus that may include a cluster generator configured to generate gas clusters, an ionizer configured to ionize the gas clusters, and an accelerator configured to accelerate the ionized gas clusters. In some embodiments, the photomask is a transmissive photomask or a reflective photomask.

Some embodiments disclosed herein include methods of correcting an optical parameter in a photomask. Such methods may include providing a photomask having a front surface on which a mask pattern is formed and a rear surface on which the mask pattern is not formed. The photomask may include multiple sections. The photomask may be exposed to light to detect an aerial image of each of the sections. A measured CD of the aerial image is compared with a designed CD of the photomask to estimate the photomask. Gas cluster ion beams are irradiated to at least one of the sections formed on the front surface of the photomask based on an estimation result to correct the optical parameter in relation to the aerial image.

In some embodiments, correcting the optical parameter includes forming a transmittance control region or a reflectance control region in the photomask to control a transmittance or reflectance of the photomask. Some embodiments provide that the transmittance control region or the reflectance control region is formed in the vicinity of the front surface of the photomask.

In some embodiments, irradiating the gas cluster ion beams is performed by a gas cluster ion beam irradiation apparatus that includes a cluster generator configured to generate gas clusters, an ionizer configured to ionize the gas clusters, and an accelerator configured to accelerate the ionized gas clusters.

BRIEF DESCRIPTION OF THE DRAWINGS

Exemplary embodiments of the inventive concept will be more clearly understood from the following detailed description taken in conjunction with the accompanying drawings in which:

FIG. 9 is a diagram illustrating a process of irradiating gas cluster ion beams to a photomask by a gas cluster ion beam irradiation apparatus, according to some embodiments as disclosed herein;

FIG. 10 is a diagram illustrating a process of irradiating monomer ion beams to a photomask, according to a comparative example of FIG. 9;

DETAILED DESCRIPTION OF THE EMBODIMENTS

Figure 1:
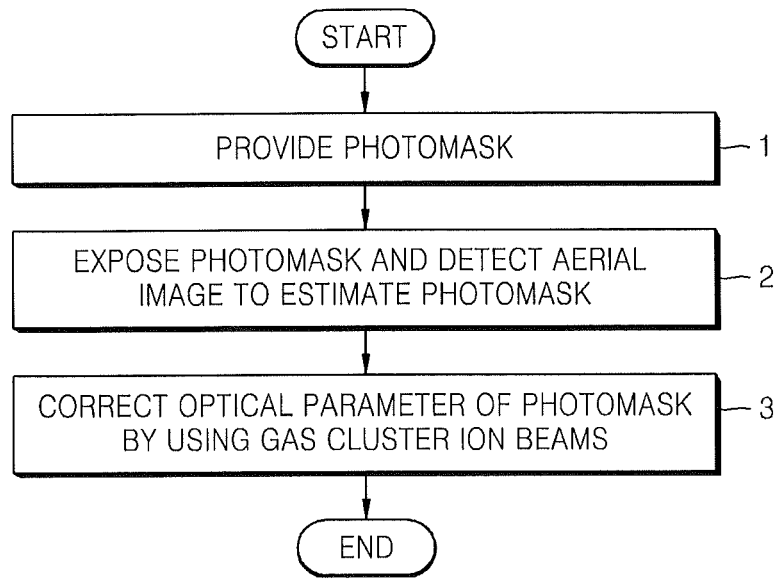
FIG. 1 is a flowchart illustrating methods of correcting an optical parameter in a photomask according to some embodiments as disclosed herein.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. Like numbers refer to like elements throughout. In the drawings, the size and relative sizes of layers and regions may be exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A photomask according to exemplary embodiments of the inventive concept may be used in a photolithography process and called a "reticle". During the photolithography process, a mask pattern formed on the photomask may be transferred to a substrate, for example, a wafer. The wafer may be a silicon wafer. A method of correcting an optical parameter of the photomask, according to an exemplary embodiment of the inventive concept, may be performed during or after a process of fabricating the photomask.

Figure 2:
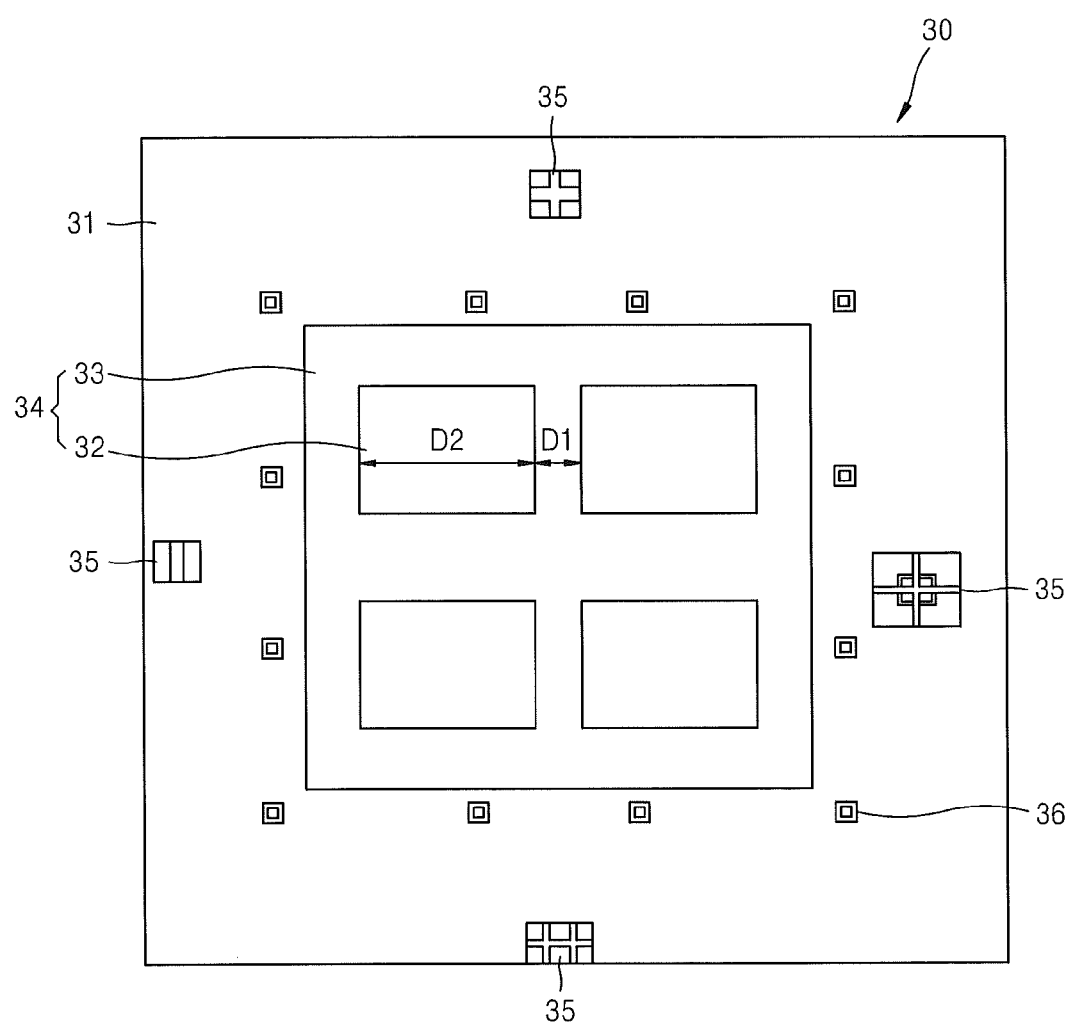
FIG. 2 is a plan view of a photomask according to some embodiments as disclosed herein.
Figure 3:
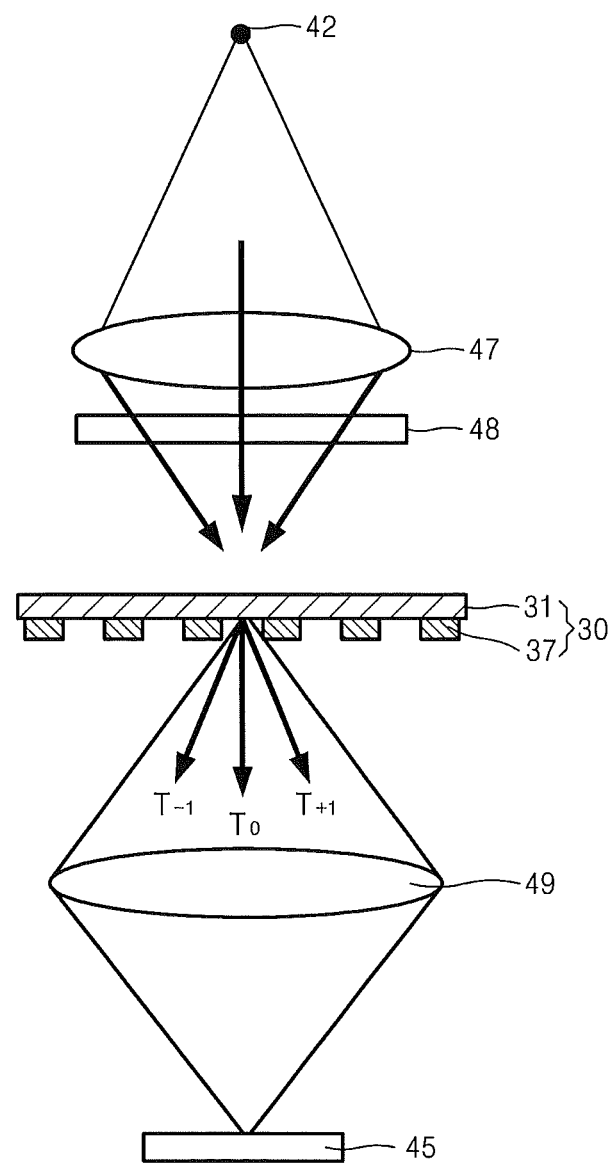
FIG. 3 is a schematic diagram of an aerial-image detection apparatus according to some embodiments as disclosed herein.

FIG. 1 is a flowchart illustrating methods of correcting an optical parameter in a photomask, according to some embodiments disclosed herein, FIG. 2 is a plan view of a photomask 30 according to some embodiments disclosed herein, and FIG. 3 is a schematic diagram of an aerial-image detection apparatus according to some embodiments disclosed herein.

Referring to FIGS. 1 and 2, the photomask 30 may be provided (block 1). The photomask 30 may include a mask pattern 37 (FIG. 3) configured to form a circuit pattern on a substrate 31. The photomask 30 may include a plurality of sections. For example, the photomask 30 may include a plurality of cell array regions 32 disposed on the substrate 31, for example, a glass substrate, and further include a peripheral circuit region 33 configured to surround the cell array regions 32. The cell array regions 32 and the peripheral circuit region 33 may constitute a chip region 34. Each of the sections may correspond to the cell array region 32 or a specific region of the cell array region 32.

When the photomask 30 is a binary mask, the mask pattern 37 may be a light blocking pattern formed of chrome (Cr). When the photomask 30 is a phase shift mask, the mask pattern 37 may be a phase shift pattern. Alignment keys 35 of various shapes may be formed outside the chip region 34. Registration measuring keys 36 may be formed along an outer circumferential surface of the chip region 34.

The formation of the photomask 30 may include forming a mask layer over the substrate 31 and patterning the mask layer to form the mask pattern 37, the alignment keys 35 and registration measuring keys 36. The mask pattern 37 may be a light blocking layer and/or a phase shift layer.

The mask pattern 37 may be manufactured such that each of the sections has a predetermined designed critical dimension (CD). However, due to various error factors of a fabrication process, the mask pattern 37 may be fabricated to have a CD that differs from the designed CD. In this regard, the CD distribution of the mask pattern 37 of the photomask 30 may become non-uniform. Even if the mask pattern 37 has the same CD as the designed CD, the CD distribution of the mask pattern 37 may become non-uniform due to exposure parameters. In this case, global CD distribution corresponding to the entire surface of the photomask 30 and/or local CD distribution corresponding to a region of the photomask 30 may become non-uniform. The non-uniformity of the local CD distribution may range from several tens to several hundreds of μm.

Thereafter, the photomask 30 may be exposed to light to detect an aerial image of the photomask 30 so that the photomask 30 may be evaluated (block 2). In some embodiments, the aerial image of the photomask 30 may be an image formed on a reference surface when the photomask 30 is actually exposed to light. Thus, the aerial image of the photomask 30 may be differentiated from a virtual aerial image formed by simulating exposure conditions. This may be because the virtual aerial image may be greatly affected by simulation conditions, which do not properly reflect actual exposure conditions.

In some embodiments, the aerial image of the photomask 30 may be generated under almost the same conditions as when the photomask 30 is transferred to a wafer. That is, the exposure process for detecting the aerial image of the photomask 30 may be performed using the same illumination system as the exposure process for transferring the photomask 30 onto the wafer. For example, the detection of the aerial image may be performed using not only 0-degree light, which reacts with the photomask 30, but also at least one of −1-degree light and +1-degree light, and/or all of 0-degree light, −1-degree light, and +1-degree light. Thus, the aerial mage according to such embodiments may be suitable to test a defect and/or uniformity in the photomask 30 under actual exposure conditions. The aerial-image detection apparatus according to some embodiments disclosed herein will now be described with reference to FIG. 3.

Referring to FIG. 3, light irradiated by a light source 42 may be transmitted through a condenser lens 47 and an illumination meter 48 onto the photomask 30. The light source 42 may irradiate light with various wavelengths, for example, deep ultraviolet (DUV) light with a wavelength of 193 nm or less. For example, the light source 42 may be an ArF laser with a wavelength of 193 nm. By use of the light source 42, a circuit pattern may be formed to a critical dimension (CD) of about 100 to 130 nm.

The photomask 30 may be referred to as a transmissive photomask since the photomask 30 transmits light. The illumination meter 48 may be the same as a scanner system used to expose a wafer to light. Thus, the illumination meter 48 may facilitate both on-axis illumination and off-axis illumination.

Among light transmitted between the mask patterns 37 of the photomask 30, all of 0-degree light T0, −1-degree light T−1, and +1-degree light T+1 may be transmitted through a projection lens 49 to a detector 45. The detector 45 may detect an aerial image embodied by the 0-degree light T0, −1-degree light T−1, and +1-degree light T+1. For example, the detector 45 may be an electronic device including a photodiode (PD), such as a charge-coupled device (CCD) or a CMOS image sensor (CIS).

The detector 45 may be very similar to a wafer exposure system except that light transmitted through the photomask 30 is not transmitted to the wafer. Thus, by use of the detector 45, a very similar aerial image to a pattern to be transferred onto the wafer may be obtained.

Although the detector 45 is illustrated to form the aerial image by using light transmitted through the photomask 30, the detector 45 may be changed to form an aerial image by using light reflected by the photomask 30. As described later, when light is not transmitted through but reflected by the photomask 30, the photomask 30 may be a reflective photomask. The reflective photomask may use extreme ultraviolet (EUV) light with a shorter wavelength than an ArF laser. Some embodiments provide that the EUV light may have a central wavelength of about 13.5 nm.

Referring again to FIGS. 1 and 2, an optical parameter of the photomask 30 may be corrected using gas cluster ion beams, based on the estimation result (block 3). When the photomask 30 is divided into sections, an optical parameter of at least one section may be corrected using gas cluster ion beams. Also, the optical parameter of the photomask 30 may be corrected using the gas cluster ion beams throughout the photomask 30 and/or only on a local region of the photomask 30. In other words, by correcting the optical parameter of the photomask 30 by using the gas cluster ion beams, any one of global CD uniformity and/or local CD uniformity of the photomask 30 may be improved. In particular, since the non-uniformity of the local CD distribution of the photomask 30 ranges from several tens to several hundreds of μm, the uniformity of the local CD distribution of the photomask 30 may be improved using gas cluster ion beams.

Methods of correcting an optical parameter by using gas cluster ion beams will be described in more detail later. In the some embodiments, the optical parameter may be related with an aerial image of the photomask 30. In other words, the aerial image of the photomask 30 may be changed by correcting the optical parameter of the photomask 30. Some embodiments provide that the optical parameter may be, for example, a transmittance and/or reflectance. The correction of the optical parameter may be performed by comparing a designed shape of the photomask 30 with the aerial image detected in operations described in block 2. For example, a designed CD of the photomask 30 may be compared with a measured CD of the aerial image.

Figure 4:
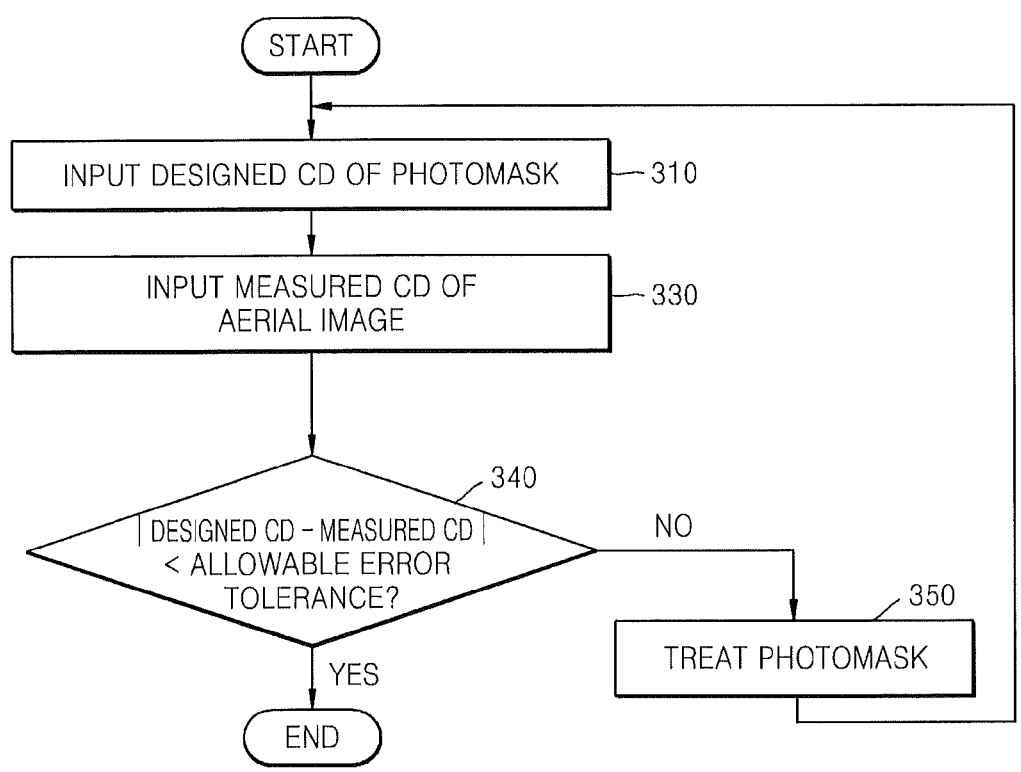
FIG. 4 is a flowchart illustrating methods of correcting an optical parameter in a photomask by using gas cluster ion beams, according to some embodiments as disclosed herein.

FIG. 4 is a flowchart illustrating methods of correcting an optical parameter in a photomask by using gas cluster ion beams, according to some embodiments disclosed herein.

Referring to FIG. 4, a designed CD of the photomask 30 may be inputted to a computer. As described with reference to FIG. 2, the designed CD may be a target CD in the fabrication of the photomask 30. In this case, the designed CD of each of the sections of the photomask 30 may be obtained.

It may be determined whether a difference in absolute value between the designed CD and the measured CD is within an allowable error tolerance (block 340). When the designed CD is equal to the measured CD, the photomask 30 may be fabricated most ideally or may exclude a semiconductor fabrication process parameter. However, a difference in absolute value between the designed and measured CDs of each of the sections may depend on errors and optimized extents of exposure conditions during fabrication of the photomask 30 or semiconductor devices. Thus, an allowed process margin of the process of fabricating or employing the photomask 30 may be set as an allowable error tolerance, and it may be determined whether a difference between the designed CD and the measured CD is within the allowable error tolerance.

When the difference in absolute value between the designed CD and the measured CD is within the allowable error tolerance, the correction process may be ended. However, when the difference in absolute value between the designed CD and the measured CD is not within the allowable error tolerance, the optical parameter needs to be further corrected. A photomask treatment process for controlling the optical parameter (e.g., a transmittance or reflectance) of the photomask 30 may be performed based on the difference in absolute value using a gas cluster ion beam irradiation apparatus (block 350). The photomask treatment process using the gas cluster ion beam irradiation apparatus will be described in more detail later.

Figure 5:
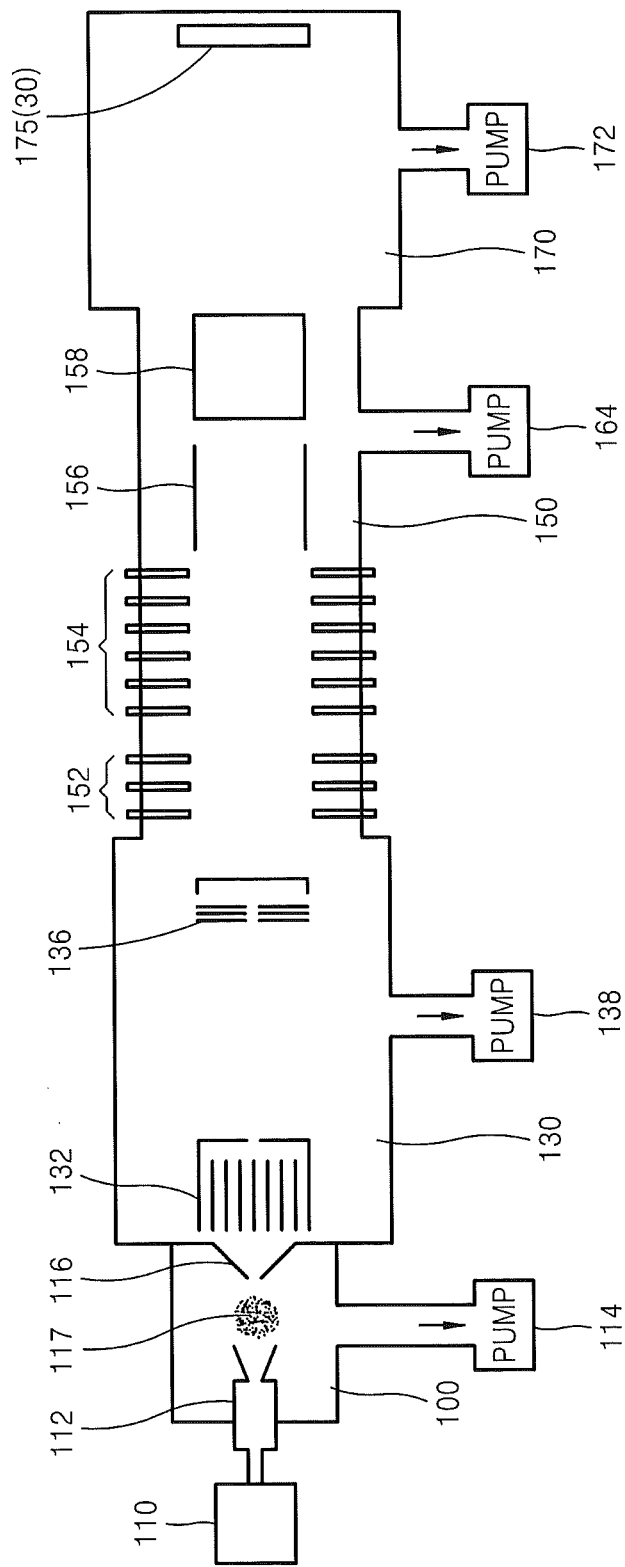
FIG. 5 is a schematic diagram of a gas cluster ion beam irradiation apparatus applied to a photomask treatment process, according to some embodiments as disclosed herein.
Figure 6:
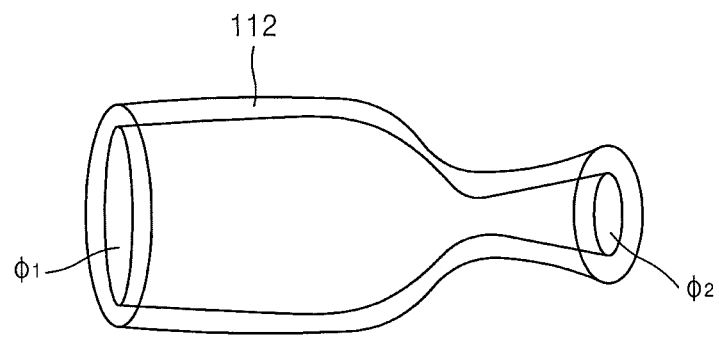
FIG. 6 is an enlarged view of a nozzle of FIG. 5.

FIG. 5 is a schematic diagram of a gas cluster ion beam irradiation apparatus applied to a photomask treatment process, according to some embodiments disclosed herein, and FIG. 6 is an enlarged view of a nozzle of FIG. 5. Specifically, the gas cluster ion beam irradiation apparatus according to some embodiments may include a cluster generator 112 and 116, an ionizer 132, a cluster measurer 136, a lens unit 152, an accelerator 154, and an irradiator 156 and 158. The cluster generator 112 and 116 may be configured to generate gas cluster ion beams. The cluster generator 112 and 116 may spray gases which may be adiabatically expanded to change the gases into a gas cluster 117. The ionizer 132 may ionize the gas clusters 117 passing through the cluster generator 112 and 116. The cluster measurer 136 may measure the magnitudes of the ionized clusters 117, i.e., gas cluster ion beams. The lens unit 152 may control the focus of the gas cluster ion beams by using the ionizer 132. The accelerator 154 may accelerate the gas cluster ion beams. The irradiator 156 and 158 may irradiate the gas cluster ion beams accelerated by the accelerator 154 toward a target 175 (i.e., photomask 30).

The cluster generator 112 and 116 may include a nozzle 112 configured to receive the high-pressure gas from a gas supplier 110 configured to supply the high-pressure gas, adiabatically expand the high-pressure gas, and generate the gas cluster 117. As shown in FIG. 6, a passage of the nozzle 112 may have a front diameter φ1 and a rear diameter φ2 disposed close to a skimmer 116. The front diameter φ1 may be greater than the rear diameter φ2. The high-pressure gas may be CO2, $SF_2$, $SF_6$, Ar, $O_2$, $N_2O$, $N_2$, $NH_3$, or a silicon-based gas. In some embodiments, $CO_2$ gas may be used as the high-pressure gas since a gas cluster may be easily generated at room temperature.

The cluster generator 112 and 116 may include the skimmer 116, which may allow only a central gas cluster of gas cluster flux to pass therethrough to remove monomers included in the gas cluster 117 generated by the nozzle 112. The nozzle 112 and the skimmer 116 may be installed in a pre-chamber 100. The nozzle 112 may be mounted at a front side of the pre-chamber 100, while the skimmer 116 may be mounted at a rear side of the pre-chamber 100. A pump 114 configured to maintain a vacuum state may be connected to the pre-chamber 100. The pre-chamber 100 may be exhausted using the pump 114, for example, a booster pump and a rotary pump, so that the pre-chamber 100 may be maintained under a lower pressure than the gas supplier 110 and the nozzle 112. The high-pressure gas may be adiabatically expanded due to a difference in pressure between the nozzle 112 and the pre-chamber 100 to form the gas cluster 117.

The ionizer 132 may ionize the gas cluster 117 supplied through the cluster generator 112 and skimmer 116. To do this, the ionizer 132 may allow accelerated electrons to collide with the gas cluster 117 to ionize the gas cluster 117. The ionized gas cluster 117 may become gas cluster ion beams. The magnitude of the gas cluster ion beams may be measured by the cluster measurer 136. The ionizer 132 and the cluster measurer 136 may be connected to the skimmer 116 mounted in the pre-chamber 100 and installed in a source chamber 130 maintained at a higher degree of vacuum than the pre-chamber 100. The source chamber 130 may be maintained under a predetermined pressure by using a pump 138, for example, a turbo-molecular pump.

The lens unit 152 may include an Einzel lens with three electrodes. The lens unit 152 may be used to condense and control the focus of gas cluster ion beams. The accelerator 154 may accelerate gas cluster ion beams focused by the lens unit 152 and apply a constant voltage of, for example, 50 to 150 KV. The lens unit 152 and the accelerator 154 may be positioned in an acceleration chamber 150. The acceleration chamber 150 may be maintained under a predetermined pressure using a pump 164.

The irradiator 156 and 158 may control an irradiation position such that gas cluster ion beams accelerated by the accelerator 154 may be precisely irradiated to a predetermined position of the target 175, for example, the photomask 30. The irradiator 156 and 158 may include a pair of deflection plates 156 and a scanner 158. The pair of deflection plates 156 may deflect the gas cluster ion beams in X- and Y-axial directions, that is, horizontal and vertical directions. The scanner 158 may precisely irradiate the gas cluster ion beams to the target 175 (i.e., photomask 30) in the X- and Y-axial directions. An aperture (not shown) may be installed in the front surface of the photomask 30 to control the amount of gas cluster ion beams irradiated to the front surface of the photomask 30. The scanner 158 and the target 170 may be positioned in the process chamber 170. The process chamber 170 may be maintained under a predetermined pressure using a pump 172.

Figure 7:
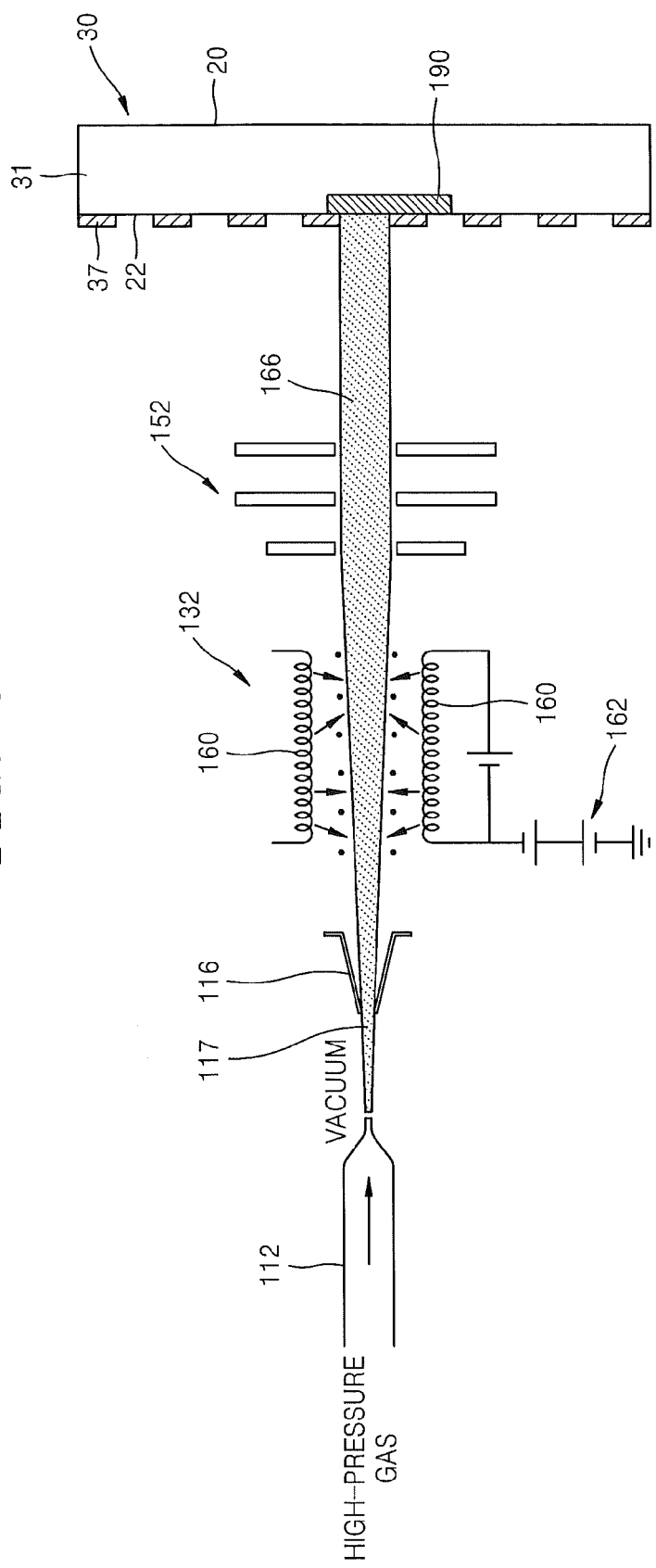
FIG. 7 is a diagram for explaining a process of forming a transmittance control region in a photomask by using a gas cluster ion beam irradiation apparatus, according to some embodiments as disclosed herein.
Figure 8:
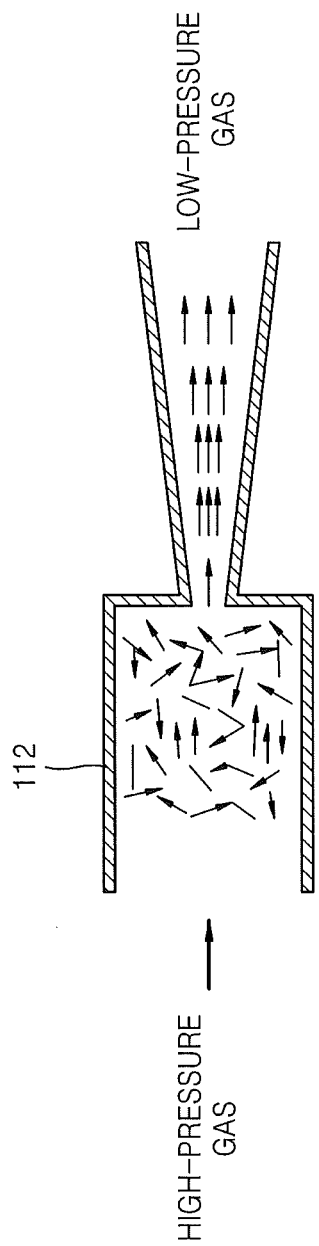
FIG. 8 is a diagram for explaining a nozzle of FIG. 7.

FIG. 7 is a diagram for explaining a process of forming a transmittance control region in a photomask using a gas cluster ion beam irradiation apparatus, according to some embodiments disclosed herein, and FIG. 8 is a diagram for explaining the nozzle 112 of FIG. 7.

Specifically, as shown in FIGS. 7 and 8, a high-pressure gas may be supplied in the directions indicated by arrows. As described above, the high-temperature gas may be $CO_2$, $SF_2$, $SF_6$, Ar, $O_2$, $N_2O$, $N_2$, and/or $NH_3$, among others. The high-temperature gas may be supplied to the nozzle 112 under a high pressure at a high temperature. The high-pressure gas supplied to the nozzle 112 may be sprayed to a low-pressure pre-chamber and adiabatically expanded to generate a low-pressure low-temperature gas cluster 117. FIG. 8 illustrates the flow of gas supplied through the nozzle 112. The gas cluster 117 may be a macromolecule consisting of several hundred to several thousands of monomers, which may have a very weak bonding force due to a Van-der Waals bond. The monomers of the gas cluster 117 may be removed by the skimmer 116 so that only a central gas cluster 117 can pass through the skimmer 116.

The gas cluster 117 may be changed into gas cluster ion beams 166 by the ionizer 132. The ionizer 132 may include a filament electrode 160, which may allow accelerated electrons to collide with the gas cluster 117, and a power source 162 connected to the filament electrode 160. The gas cluster ion beams 166 ionized by the ionizer 132 may be focused by the lens unit 152, accelerated by the accelerator 154, and irradiated to the target 175, that is, the photomask 30. Constituent atoms of the gas cluster 117 may be disposed near the surface of the target 175 (or photomask 30) and have a high reactivity. When the constituent atoms of the gas cluster 117 are ionized with acceleration energy, the constituent atoms may share the acceleration energy to generate low-energy gas cluster ion beams 166. The gas cluster ion beams 166 may be irradiated to a front surface 22 of the photomask 30 having the mask pattern 37, to form a transmittance control region 190 in the vicinity of the front surface 22 of the photomask 30. As described later, when the transmittance control region 190 is formed in the vicinity of the front surface 22 of the photomask 30, the transmittance control region 190 may be formed to a small depth of, for example, about 100 Å or less, specifically, 20 Å or less, from the front surface 22 of the photomask 30. Referring to FIG. 7, reference numeral 20 denotes a rear surface of the photomask 30. The transmittance control region 190 may be provided to control a transmittance, which is an optical parameter of the photomask 30.

The CD of the mask pattern 37 may be corrected using the transmittance control region 190. The CD uniformity of the photomask 30 may be improved by correcting the CD of the mask pattern 37. According to the inventive concept, both the global CD uniformity and local CD uniformity of the photomask 30 may be improved. In particular, since the CD of the mask pattern 37 may be corrected using gas cluster ion beams with a low energy, the CD non-uniformity of a local region with an area of several tens to several hundreds of μm may be corrected without damaging the mask pattern 37.

Although FIG. 7 illustrates that the gas cluster ion beams 166 are irradiated to the vicinity of the front surface 22 of the photomask 30, according to some embodiments, the gas cluster ion beams 166 may be irradiated to the vicinity of the rear surface 20 of the photomask 30 to form the transmittance control region 190 without damaging the mask pattern 37. Similarly, when the transmittance control region 190 is formed in the vicinity of the rear surface 20 of the photomask 30, the transmittance control region 190 may be formed to a small depth of, for example, about 100 Å or less, specifically, 20 Å or less, from the rear surface 20 of the photomask 30.

FIG. 9 is a diagram illustrating a process of irradiating gas cluster ion beams to a photomask by a gas cluster ion beam irradiation apparatus, according to some embodiments disclosed herein, and FIG. 10 is a diagram illustrating a process of irradiating monomer ion beams to a photomask as a comparative example of FIG. 9.

Specifically, in the gas cluster ion beam irradiation apparatus according to some embodiments of the inventive concept, an ionizer 132 may ionize a gas cluster formed by a nozzle 112 to form gas cluster ion beams 166, and an accelerator 154 may accelerate the gas cluster ion beams 166. The gas cluster ion beams 166 may include a lot of constituent atoms, and only atoms 166a disposed near the surface of a target 175 (or photomask 30) may be ionized by the ionizer 132.

As described above, the accelerated gas cluster ion beams 166 may be irradiated to the target 175, i.e., the photomask 30. Since the gas cluster ion beams 166 are obtained by accelerating the gas cluster formed due to adiabatic expansion, the gas cluster ion beams 166 have a low energy. Thus, the gas cluster ion beams 166 may penetrate the front surface of the target 175, that is, the photomask 30 to a small depth d1 of for example, about 100 Å or less, specifically, 20 Å or less, thereby minimizing damage to the photomask 30.

As described above, the gas cluster ion beams 166 may be irradiated to the front surface or rear surface of the photomask 30 to form the transmittance control region 190. The transmittance control region 190 may reduce a transmittance to correct the CD of the photomask 30. Although the transmittance control region 190 may be formed on the front surface or rear surface of the photomask 30, the transmittance control region 190 may be formed on the front surface of the photomask 30 to further improve the effects of the inventive concept.

FIG. 10 illustrates the comparative example of FIG. 9. As shown in FIG. 10, gas plasma may pass through an extractor 182 to generate a monomer ion beam 184. The monomer ion beam 184, which may include a single atom, may be accelerated by the accelerator 154 and irradiated to the target 175, that is, the photomask 30. The monomer ion beam 184 may be irradiated to the target 175, that is, the photomask 30, in a wholly ionized state or a high-energy state. Thus, the monomer ion beam 184 may penetrate the front surface of the photomask 30 to a depth d2 that is greater than the depth d1, for example, a depth d2 of about 1000 Å, thereby increasing damage to the photomask 30.

Figure 11:
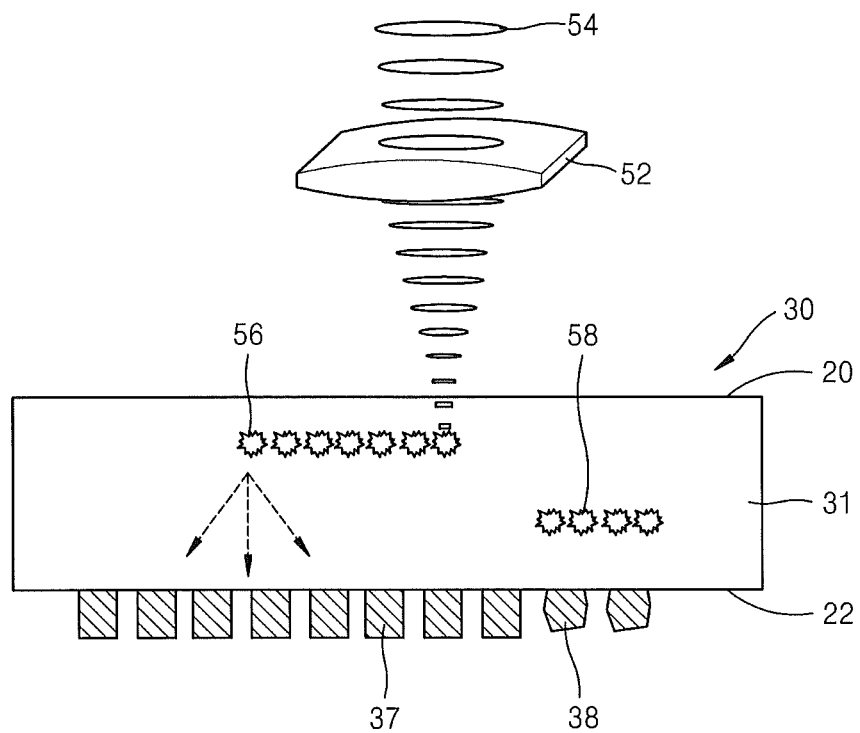
FIGS. 11 and 12 are diagrams illustrating a method of correcting an optical parameter by using laser beams, according to a comparative example of some embodiments as disclosed herein.
Figure 12:
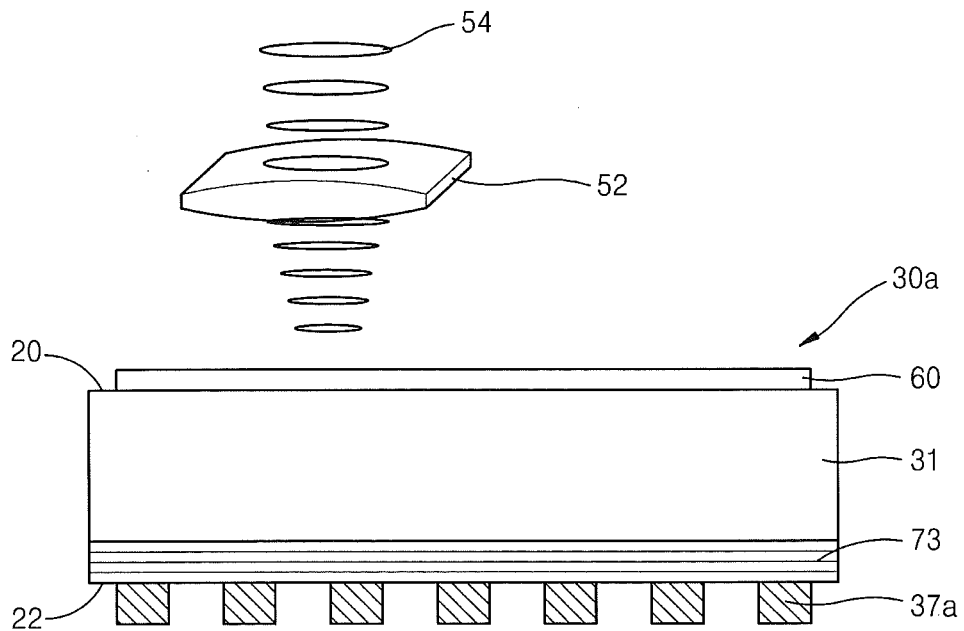

FIGS. 11 and 12 are diagrams illustrating methods of correcting an optical parameter by using laser beams, according to a comparative example of the inventive concept.

Specifically, FIG. 11 illustrates a transmissive photomask 30. The optical parameter (e.g., transmittance) of the transmissive photomask 30 may be controlled by irradiating laser beams 54 to a rear surface 20 of the transmissive photomask 30 by using a focusing lens 52 to form transmittance control regions 56 and 58.

However, since the laser beams 54 have a high energy, damage may occur on the transmissive photomask 30 in the directions indicated by arrows. Also, since the laser beams 54 may cause damage to the transmissive photomask 30, the laser beams 54 may not be irradiated to a front surface 22 of the transmissive photomask 30. Also, the high-energy laser beams 54 may make it difficult to control the depth of the transmittance control regions 56 and 58 formed in a mask substrate 31. In particular, the transmittance control region 58 may sustain damage to a mask pattern 38.

Next, FIG. 12 illustrates a reflective photomask 30a. A mask pattern (or absorption pattern) 37a and a reflection layer 73 may be formed on a front surface 22 of the reflective photomask 30a, while a conductive layer 60 may be formed on a rear surface 20 of the reflective photomask 30a. Thus, when an optical parameter is corrected, the conductive layer 60 may prevent the focusing lens 52 from irradiating laser beams 54 to the rear surface 20 of the photomask 30a. In other words, the reflective photomask 30a may not control the CD of the mask pattern 37a by using the laser beams 54.

Figure 13:
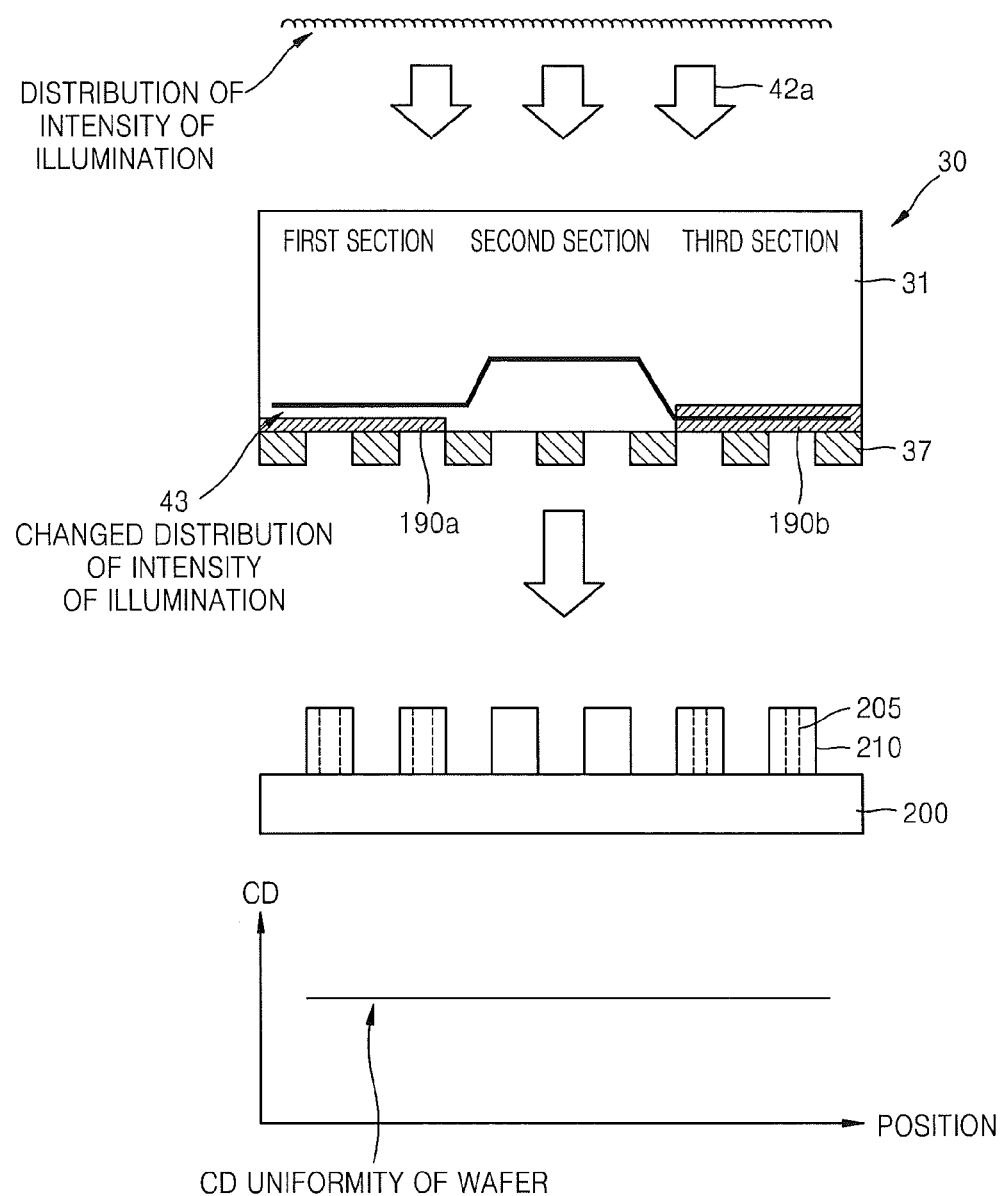
FIG. 13 is a schematic diagram illustrating a process of attaining CD uniformity on a wafer by using a photomask on which a transmittance control region is formed, according to some embodiments as disclosed herein.

FIG. 13 is a schematic diagram illustrating a process of attaining CD uniformity on a wafer by using a photomask on which a transmittance control region is formed, according to some embodiments disclosed herein.

Referring to FIG. 13, a first section where a first transmittance control region 190a is formed, a second section where no transmittance control region is formed, and a third section where a second transmittance control region 190b is formed may be illustrated in the photomask 30. The thickness or depth of the first transmittance control region 190a may be smaller than the thickness or depth of the second transmittance control region 190b. As a result, the intensity of illumination passing through the second section having no transmittance control region may be highest, the intensity of illumination passing through the second transmittance control region 190b may be lowest, and the intensity of illumination passing through the first transmittance control region 190a may be intermediate between the two intensities of illumination.

Thus, the distribution of intensity of illumination in the photomask 30 may be changed, and a changed distribution 43 of intensity of illumination may pass through the mask pattern 37 and be transferred to a wafer 200. Thus, a pattern with a uniform CD may be printed on the wafer 200 instead of a conventional pattern 205 with a non-uniform CD. As described above, by forming the transmittance control region in each of the sections, the CD uniformity of the photomask 30 may be generally improved, thereby enhancing short uniformity of the wafer 200.

Figure 14:
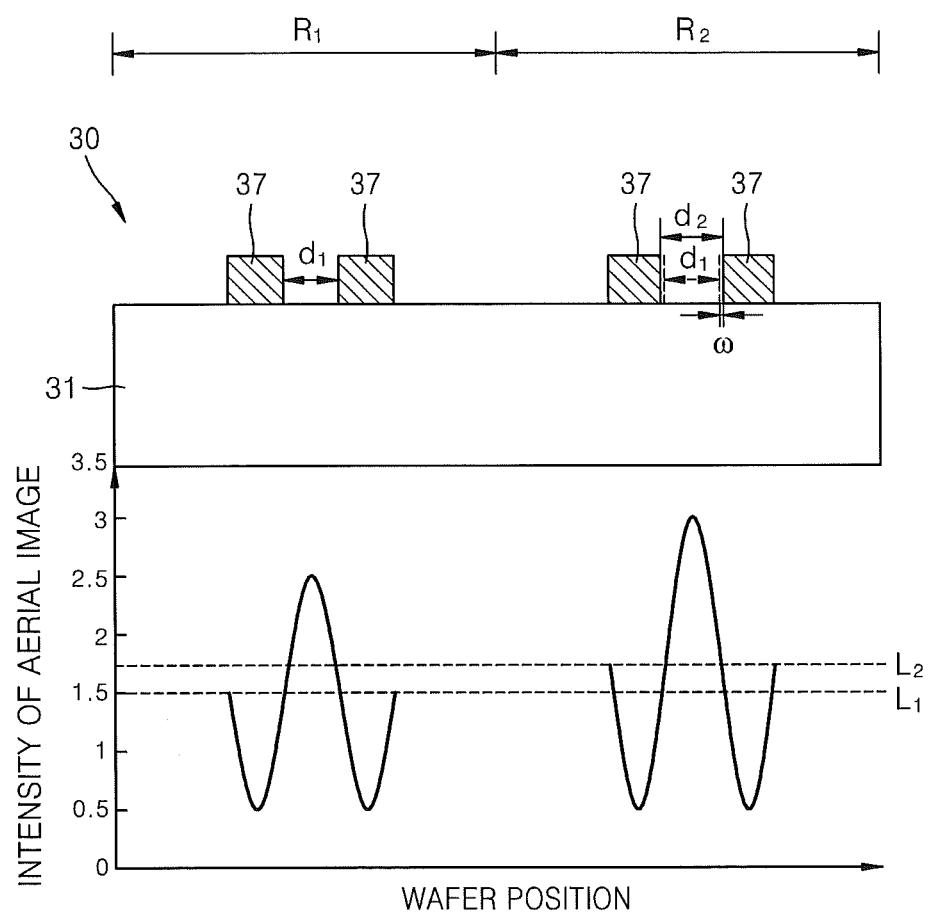
FIG. 14 is a diagram of a photomask having a non-uniform CD and the intensity of an aerial image of the photomask.

FIG. 14 is a diagram of a photomask having a non-uniform CD and the intensity of an aerial image of the photomask. Specifically, a photomask 30 may include a first region R1 having a normal depth (or normal CD) d1 and a second region R2 having an abnormal depth d2 on the basis of a mask pattern 37. The abnormal depth d2 may correspond to d1+2ω, and ω may be less than the wavelength λ of a light source and the normal depth d1. The intensity of an aerial image detected by exposing the photomask 30 may vary according to a difference between the depths (or CDs) d1 and d2 of the mask pattern 37. Here, by performing reverse correction to equalize an oscillation axis L2 of an image intensity curve corresponding to the second region R2 to an oscillation axis L1 of an image intensity curve corresponding to the first region R1, the transmittance of the second region R2 may be corrected.

Figure 15:
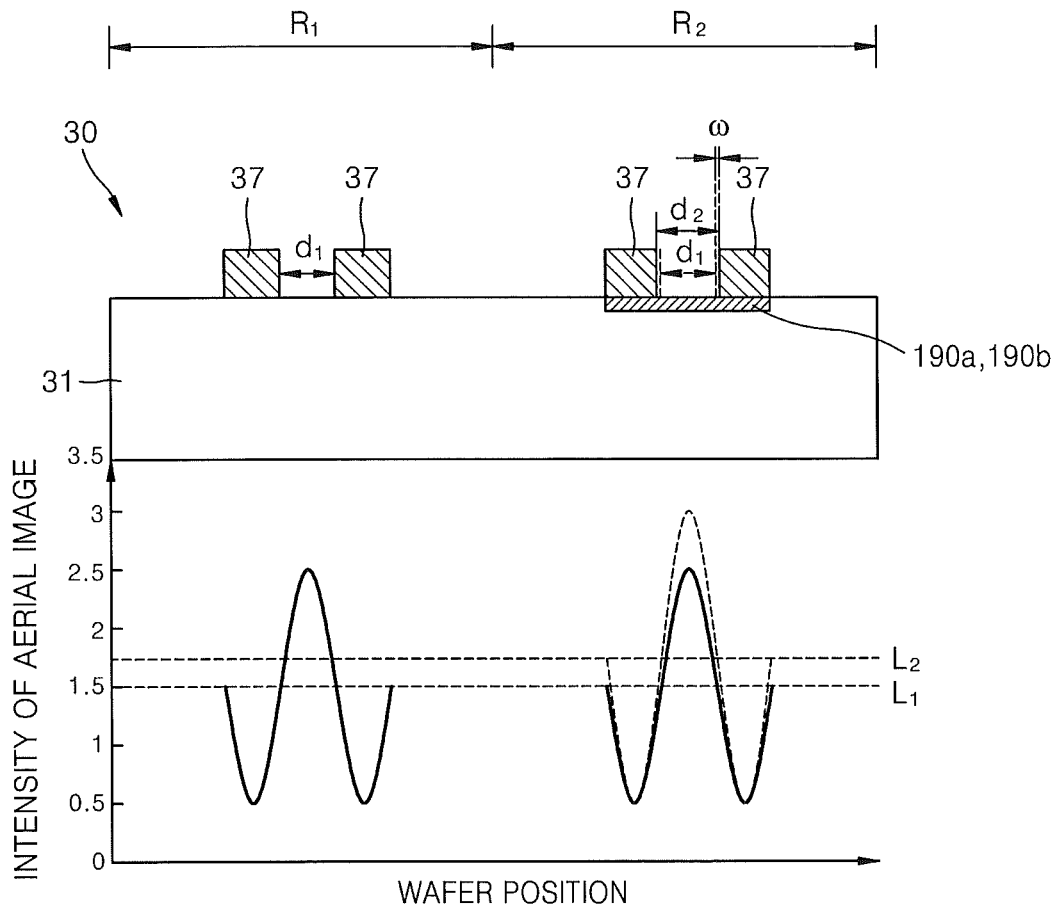
FIG. 15 is a diagram of a corrected photomask according to some embodiments of the present invention and the intensity of an aerial image of the photomask.

FIG. 15 is a diagram of a corrected photomask according to some embodiments disclosed herein and the intensity of an aerial image of the photomask. Specifically, a transmittance control region 190a or 190b may be formed in a second region R2 of a photomask 30 to control the intensity of an aerial image of the second region R2. Thus, the intensity of the aerial image may be controlled to ensure the CD uniformity of the photomask 30.

Although the above-described embodiments describe that the photomask 30 may be corrected based on a transmittance, some embodiments provide that the photomask 30 may be corrected based on a reflectance.

Figure 16:
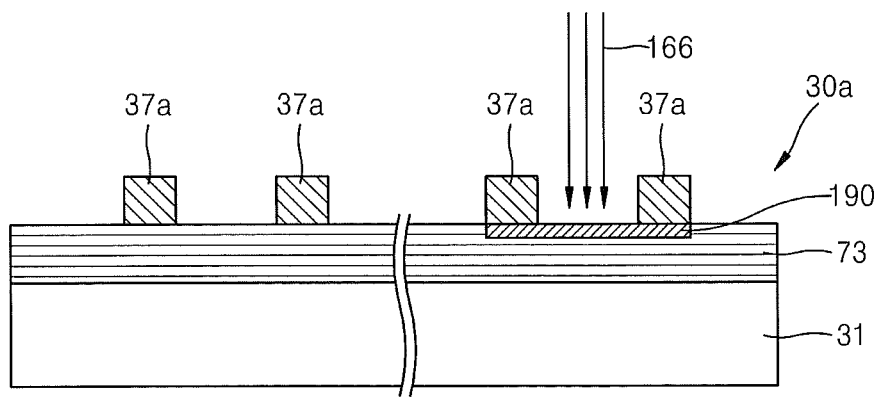
FIG. 16 is a cross-sectional view of a corrected reflective photomask according to some embodiments as disclosed herein.

FIG. 16 is a cross-sectional view of a corrected reflective photomask 30a according to an exemplary embodiment of the inventive concept. Specifically, as described above, the reflective photomask 30a may include a multilayered reflective layer 73, which may be formed on a substrate 31, and a mask pattern 37a (i.e., absorption pattern) disposed on the reflective layer 73. As described above, a reflectance control region 190 may be formed by irradiating gas cluster ion beams 166 to the reflection layer 73 of the photomask 30a. When the gas cluster ion beams 166 are irradiated to the reflection layer 73, the reflectance of the reflection layer 73 may be changed. That is, the thicknesses and physical properties of layers of the reflection layer 73 may be changed to vary the reflectance of the reflection layer 73.

While the inventive concept has been particularly shown and described with reference to exemplary embodiments thereof, it will be understood that various changes in form and details may be made therein without departing from the spirit and scope of the following claims.

What is claimed is:

1. A method of correcting an optical parameter in a photomask, the method comprising:
  providing a photomask;
  exposing the photomask and detecting an aerial image that estimates the photomask; and
  irradiating gas cluster ion beams to the photomask based on an estimation result to correct the optical parameter in the photomask in relation to the aerial image,
  wherein irradiating the gas cluster ion beams is performed by a gas cluster ion beam irradiation apparatus comprising:
    a cluster generator configured to generate gas clusters;
    an ionizer configured to ionize the gas clusters; and
    an accelerator configured to accelerate the ionized gas clusters.

2. The method of claim 1, wherein the gas cluster ion beams are irradiated to a front surface of the photomask on which a mask pattern is formed or a rear surface of the photomask on which the mask pattern is not formed.

3. The method of claim 1, wherein the optical parameter is a transmittance.

4. The method of claim 1, wherein the optical parameter is a reflectance.

5. The method of claim 1, wherein estimating the photomask comprises comparing a measured critical dimension (CD) of the aerial image with a designed CD of the photomask.

6. The method of claim 5, wherein correcting the optical parameter comprises correcting the transmittance of the photomask based on a result of a comparison between the measured CD and the designed CD, and
  wherein correcting the transmittance of the photomask comprises forming a transmittance control region in the photomask.

7. The method of claim 5, wherein correcting the optical parameter comprises correcting the reflectance of the photomask based on a result of a comparison between the measured CD and the designed CD, and
  wherein correcting the reflectance of the photomask comprises forming a reflectance control region in the photomask.

8. A method of correcting an optical parameter in a photomask, the method comprising:
  providing a photomask including a plurality of sections;
  exposing the photomask to light to detect an aerial image of each of the plurality of sections;
  comparing a measured critical dimension (CD) of the aerial image with a designed CD of the photomask to estimate the photomask; and
  irradiating gas cluster ion beams to at least one of the plurality of sections based on an estimation result to correct the optical parameter in relation with the aerial image,
  wherein correcting the optical parameter comprises forming a transmittance control region or a reflectance control region in the photomask based on a result of a comparison between the measured CD and the designed CD to correct a transmittance or a reflectance of the photomask,
  wherein the transmittance control region or the reflectance control region is formed in the vicinity of a front surface of the photomask on which a mask pattern is formed or in the vicinity of a rear surface of the photomask on which the mask pattern is not formed, and
  wherein irradiating the gas cluster ion beams is performed by a gas cluster ion beam irradiation apparatus comprising:
    a cluster generator configured to generate gas clusters;
    an ionizer configured to ionize the gas clusters; and
    an accelerator configured to accelerate the ionized gas clusters.

9. The method of claim 8, wherein exposing the photomask to detect the aerial image of each of the plurality of sections is performed using the same illumination system as an exposure process for transferring the photomask to a wafer.

10. The method of claim 8, wherein the photomask is a transmissive photomask or a reflective photomask.

11. A method of correcting an optical parameter in a photomask, the method comprising:
  providing a photomask having a front surface on which a mask pattern is formed and a rear surface on which the mask pattern is not formed, the photomask including a plurality of sections;
  exposing the photomask to light to detect an aerial image of each of the plurality of sections;

comparing a measured CD of the aerial image with a designed CD of the photomask to estimate the photomask; and irradiating gas cluster ion beams to at least one of the plurality of sections formed on the front surface of the photomask based on an estimation result to correct the optical parameter in relation to the aerial image, wherein correcting the optical parameter comprises forming a transmittance control region or a reflectance control region in the photomask to control a transmittance or reflectance of the photomask.

12. The method of claim 11, wherein the transmittance control region or the reflectance control region is formed in the vicinity of the front surface of the photomask.

13. The method of claim 11, wherein irradiating the gas cluster ion beams is performed by a gas cluster ion beam irradiation apparatus comprising:

a cluster generator configured to generate gas clusters;

an ionizer configured to ionize the gas clusters; and an accelerator configured to accelerate the ionized gas clusters.

* * * * *